United States Patent
Tsai et al.

(10) Patent No.: US 9,539,621 B2
(45) Date of Patent: Jan. 10, 2017

(54) WAFER CLEANING DEVICE AND METHOD THEREOF

(71) Applicant: UNITED MICROELECTRONICS CORP., Hsin-Chu (TW)

(72) Inventors: Hsin-Ting Tsai, Hsinchu (TW); Cheng-Hung Yu, Taoyuan County (TW); Chin-Kuang Liu, Hsinchu (TW); Ming-Hsin Lee, Taoyuan County (TW); Wei-Hong Chuang, Taoyuan County (TW); Kuei-Chang Tung, Miaoli County (TW); Yan-Yi Lu, Taoyuan County (TW); Chin-Chin Wang, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 342 days.

(21) Appl. No.: 14/108,376

(22) Filed: Dec. 17, 2013

(65) Prior Publication Data
US 2014/0096800 A1    Apr. 10, 2014

Related U.S. Application Data

(62) Division of application No. 12/635,710, filed on Dec. 11, 2009, now Pat. No. 8,707,974.

(51) Int. Cl.
*B08B 3/04* (2006.01)
*H01L 21/67* (2006.01)
*B08B 3/02* (2006.01)

(52) U.S. Cl.
CPC . *B08B 3/04* (2013.01); *B08B 3/02* (2013.01); *H01L 21/6708* (2013.01); *H01L 21/67051* (2013.01)

(58) Field of Classification Search
CPC .......... B08B 3/02; B08B 3/04; H01L 21/6708; H01L 21/67028; H01L 21/67052; H01L 21/67051; H01L 21/02052
USPC .......... 134/98, 135, 144, 148, 151, 153, 902
See application file for complete search history.

(56) References Cited

U.S. PATENT DOCUMENTS

| | | | |
|---|---|---|---|
| 5,349,978 A | 9/1994 | Sago | |
| 5,740,488 A | 4/1998 | Fujimoto | |
| 6,139,913 A | 10/2000 | Van Steenkiste | |
| 6,151,744 A | 11/2000 | Ohtani | |
| 6,634,806 B2 * | 10/2003 | Toshima | G03F 7/3021 134/902 |
| 7,025,514 B2 | 4/2006 | Shimada | |
| 2003/0029479 A1 | 2/2003 | Asano | |
| 2003/0079764 A1 | 5/2003 | Hirose | |
| 2005/0124518 A1 | 6/2005 | Sugimoto | |

(Continued)

FOREIGN PATENT DOCUMENTS

| | | |
|---|---|---|
| CN | 1400632 A | 3/2003 |
| CN | 1444256 A | 9/2003 |

(Continued)

*Primary Examiner* — Saeed T Chaudhry
(74) *Attorney, Agent, or Firm* — Winston Hsu; Scott Margo

(57) ABSTRACT

A wafer cleaning device comprising a wafer stage for holding a wafer having a surface to be washed, a first nozzle positioned above the wafer, a second nozzle positioned above the wafer. A first height is between the first nozzle and the surface and a second height is between the second nozzle and the surface, wherein the first height is shorter than the second height.

12 Claims, 5 Drawing Sheets

(56) References Cited

U.S. PATENT DOCUMENTS

| | | | |
|---|---|---|---|
| 2005/0223980 A1* | 10/2005 | Awamura | ............ G03F 7/30 118/708 |
| 2006/0081269 A1 | 4/2006 | Kim | |
| 2007/0113874 A1 | 5/2007 | Izumi | |

FOREIGN PATENT DOCUMENTS

| | | | |
|---|---|---|---|
| CN | 1852778 | A | 10/2006 |
| CN | 1883035 | A | 12/2006 |
| CN | 101204708 | A | 6/2008 |
| CN | 101405091 | A | 4/2009 |
| CN | 101414549 | A | 4/2009 |
| JP | P2000262996 | A | 9/2000 |
| JP | P2006809 | A | 1/2006 |
| JP | P2007324249 | A | 12/2007 |
| JP | 2008108830 | A | 5/2008 |
| TW | 200802532 | | 1/2008 |
| TW | 200937507 | | 9/2009 |
| TW | 200949917 | | 12/2009 |

* cited by examiner

WAFER CLEANING DEVICE AND METHOD THEREOF

CROSS REFERENCE TO RELATED APPLICATIONS

This patent application is a divisional application of and claims priority to U.S. patent application Ser. No. 12/635,710, filed on Dec. 11, 2009, and entitled "WAFER CLEANING DEVICE AND METHOD THEREOF" the entire contents of which are incorporated herein by reference.

BACKGROUND OF THE INVENTION

1. Field of the Invention

The present invention relates to a wafer cleaning device and method of cleaning a wafer.

2. Description of the Prior Art

The formation of semiconductor device includes a lot of steps, such as implantation of dopants, formation of a gate oxide layer, deposition of a metal layer, etching process, and chemical mechanical polishing. It is well-known that there is a need to clean a wafer where a fabrication operation has been performed that leaves unwanted residues on the surfaces, edges, bevels, and notches of wafers.

One wafer cleaning method commonly employed is wet cleaning. Generally, during a cleaning process, a cleaning solution such as deionized water, or other cleaning solutions is utilized to clean residues on a wafer, and the deionized water or cleaning solutions along with the residues is spun out of the surface of the wafer.

A traditional wafer cleaning device includes a liquid supply system including a plurality of pipes, and a plurality of straight nozzles, each connecting to one end of the pipe. However, during the cleaning process, the cleaning solution may form turbulence on the periphery of the wafer. Then the residues washed away from the center of the wafer will stay on the surface of the wafer, so stains or striation defects may form.

In view of the foregoing, there is a need for a cleaning apparatus and process that avoid the problems of the prior art by cleaning residues on the wafer completely.

SUMMARY OF THE INVENTION

According to a preferred embodiment of the present invention, a wafer cleaning device is proposed, comprising: a stage for holding a wafer having a surface, a first nozzle positioned above the wafer, and a first height disposed between the first nozzle and the surface and a second nozzle positioned above the wafer, and a second height disposed between the second nozzle and the surface, wherein the first height is shorter than the second height.

According to another preferred embodiment of the present invention, a wafer cleaning device is proposed, comprising: a stage for holding a wafer having a surface and a nozzle positioned above the wafer, and the nozzle comprising a plurality of openings, wherein heights are distances between the surface and each of the openings, the heights between the surface and each of the openings are different along with the relative location of each of the openings to the surface.

According to another preferred embodiment of the present invention, a wafer cleaning method is proposed, comprising: providing a wafer having a surface and at least one nozzle above the wafer and rotating the wafer and spraying a cleaning solution by the nozzle to clean the surface, wherein the nozzle has a spraying parameter, and the spraying parameter is a function of the relative location of the nozzle to the surface.

According to another preferred embodiment of the present invention, a wafer cleaning method is proposed, comprising: providing a wafer having a surface and a nozzle comprising a plurality of openings above the wafer and rotating the wafer and spraying a cleaning solution from each of the openings to clean the surface, wherein each of the openings has a spraying parameter individually, and the spraying parameter is a function of the relative location of each of the opening to the surface.

The feature of the present invention is that the nozzle has a spraying parameter which is a function of the relative location of the nozzle to the surface or a function of the relative location of each of the openings to the surface. For instance, when the nozzles are different in horizontal position, the distance between the nozzle and the surface, the flow rate of the cleaning solution, the cleaning solution used, the ratio between the cleaning solution and the gas, or the concentration of the cleaning solution would be different. Therefore, the center and the periphery of the wafer may have different cleaning conditions. In this way, the residues on the surface can be removed completely.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
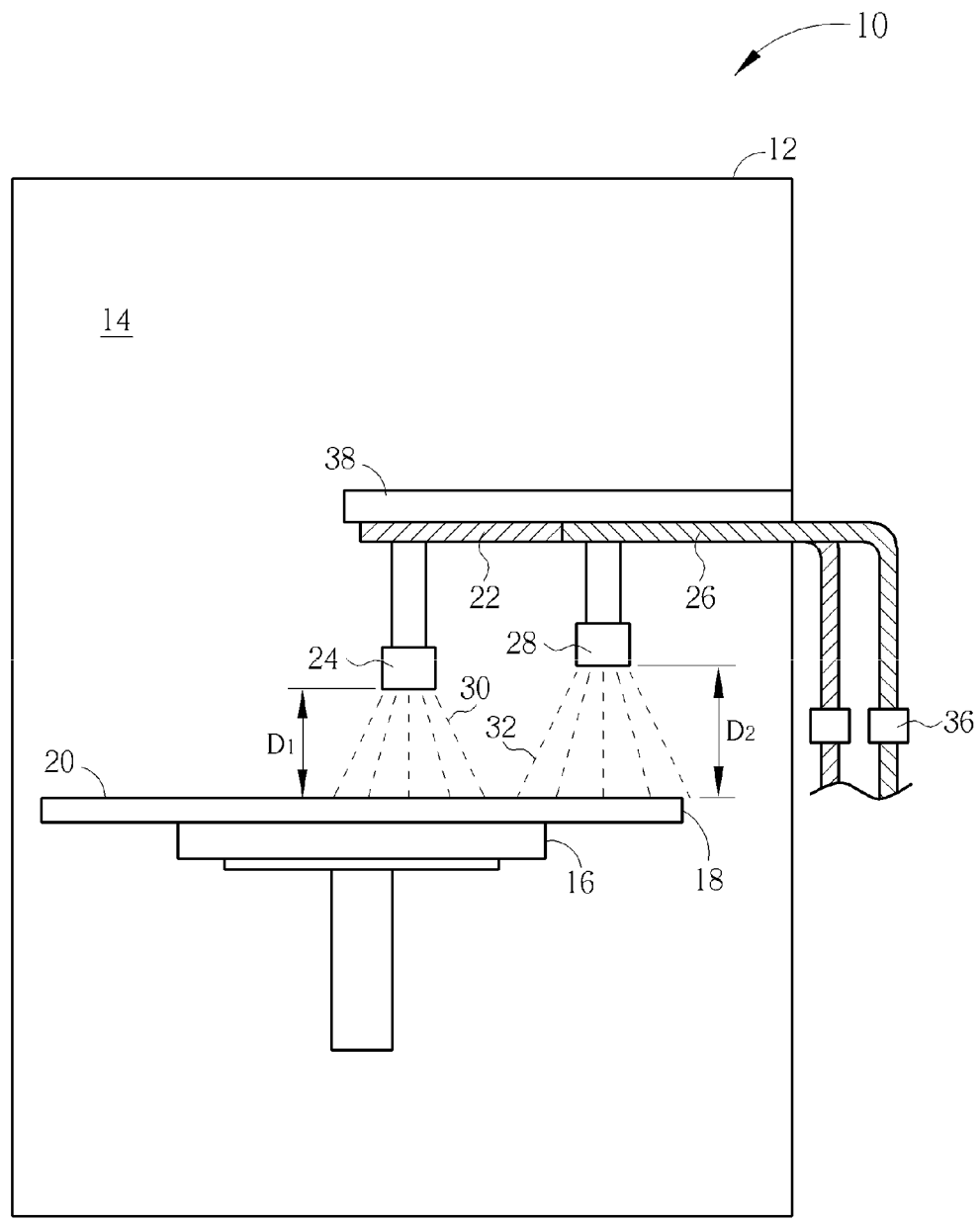
FIG. 1 depicts a wafer cleaning device schematically according to the first embodiment of the present invention.

FIG. 1 depicts a wafer cleaning device schematically according to the first embodiment of the present invention. As shown in FIG. 1, a wafer cleaning device 10 includes a case 12 including a chamber 14. A stage 16 is disposed at the bottom of the chamber 14 for holding and rotating a wafer 18. The wafer 18 has a surface 20 to be washed. The chamber 14 can be a closed environment having controlled temperature, controlled pressure and other parameters. The wafer 18 can be attached on the stage 16 by methods of vacuum suction, electrostatic attraction or mechanical clip. A first transfer pipe 22 is disposed at the upper part of the chamber 14. A first nozzle 24 connects to one end of the first transfer pipe 22, and the first nozzle 24 is disposed near and above the center of the wafer 18. A second transfer pipe 26 is disposed at the upper part of the chamber 14 and adjacent to the first transfer pipe 22. A second nozzle 28 connects to one end of the second transfer pipe 26. The first nozzle 24 and the second nozzle 28 the first nozzle and the second nozzle are disposed on different radiuses of the wafer.

Comparing to the first nozzle 24, the second nozzle 28 is disposed farther from the center of the wafer 18. A first height $D_1$ exists between the first nozzle 24 and the surface 20. A second height $D_2$ exists between the second nozzle 28 and the surface 20. It is noteworthy that the first height $D_1$ is shorter than the second height $D_2$. Preferably, the first height $D_1$ is 1 cm shorter than the second height $D_2$. In this way, under the condition that the cleaning solution has the same flow rate, a first cleaning solution 30 sprayed from the first nozzle 24 will reach the surface 20 earlier that a second cleaning solution 32 sprayed from the second nozzle 28. Therefore, the residues on the surface 20 near the center of the wafer 18 will be washed away by the first cleaning solution 30. Next, the second cleaning solution 32 will wash the peripheral surface 20 of the wafer 18, and bring the residues previously washed by the first cleaning solution 30 to the periphery of the wafer 18. Then, as the wafer 18 is rotating, all the residues washed away by the first cleansing solution 30 and the second cleaning solution 32 will be spun out of the wafer 18 by the centrifugal force. In addition, to increase the cleaning efficiency, the first cleaning solution 30 and second cleaning solution 32 can be pressurized to make the flow rate of the first cleaning solution 30 0.1 l/min greater than the flow rate of the second cleaning solution 32. Although the first nozzle 24 and the second nozzle 28 are connected to the first transfer pipe 22 and the second transfer pipe 26 respectively, in other preferred embodiment, the first nozzle 24 and the second nozzle 28 can be connected to the same transfer pipe and inputted the same cleaning solution.

Figure 2:
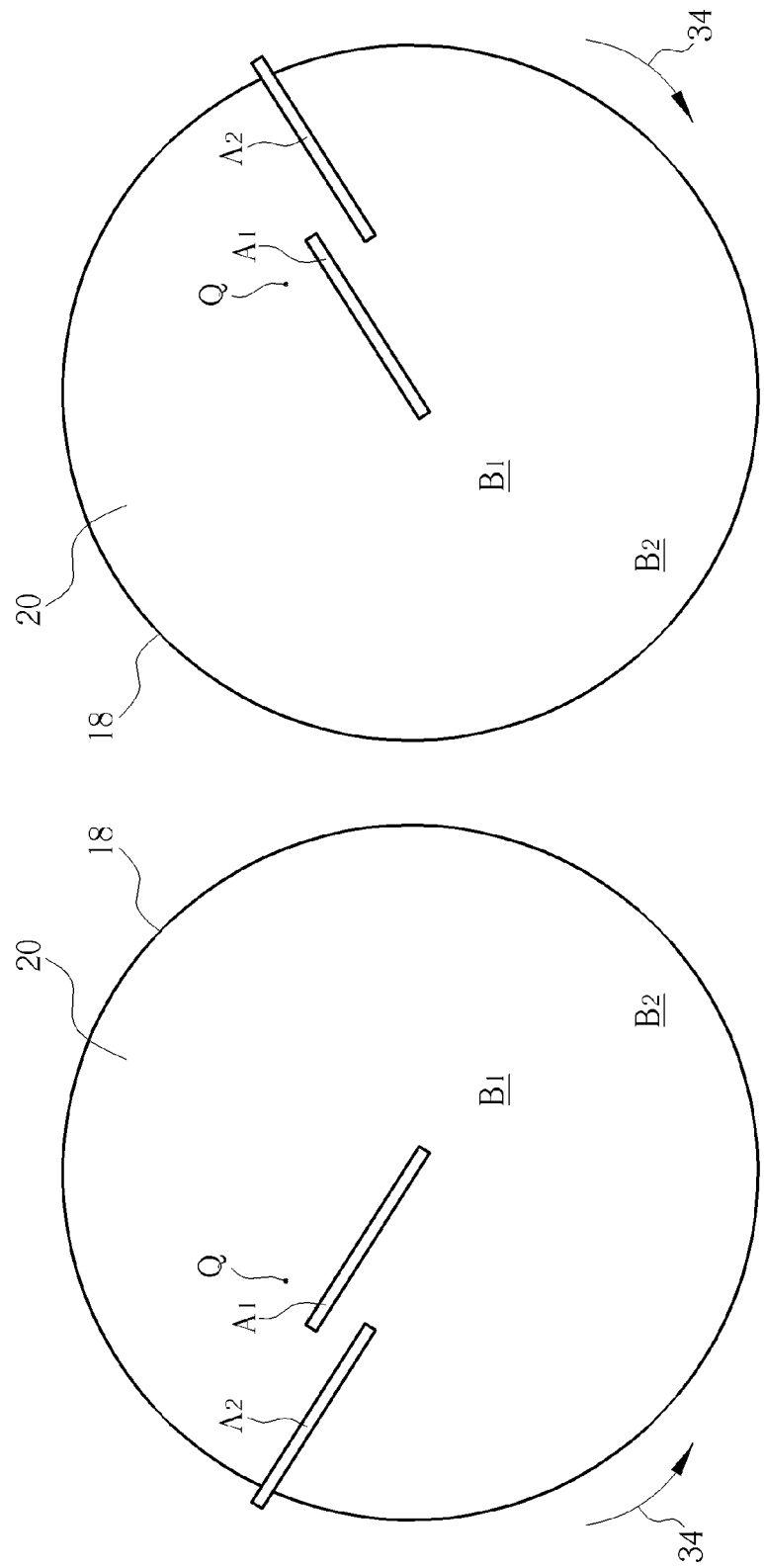
FIG. 2 depicts schematically a top view of a rotating wafer cleaned by a cleaning solution according to the first embodiment of the present invention.

FIG. 2 depicts schematically a top view of a rotating wafer cleaned by a cleaning solution according to the first embodiment of the present invention. As shown in FIG. 1 and FIG. 2, the first cleaning solution 30 sprayed from the first nozzle 24 forms a first spraying area $A_1$ covering part of the surface 20. The second cleaning solution 32 sprayed from the second nozzle 28 forms a second spraying area $A_2$ covering part of the surface 20. The size of the first spraying area $A_1$ and the second spraying area $A_2$ can be adjusted individually. The first spraying area $A_1$ and the second spraying area $A_2$ can be staggered. In other words, the first spraying area $A_1$ and the second spraying area $A_2$ are not on the same radius. In addition, the first spraying area $A_1$ also covers around the center of the wafer 18. When the wafer 18 is rotated, the first spraying area $A_1$ forms a first clean region $B_1$ like a circle, and the second spraying area $A_2$ forms a second clean region $B_2$ like a ring.

During the wafer cleaning process, the wafer 18 is rotated toward a predetermined direction 34, such as clockwise or counterclockwise. A given point Q on the surface 20 will pass the first spraying area $A_1$, and pass the second spraying area $A_2$ later. In this way, on the same radius, the point which is nearer the center of the wafer 18 will pass the first cleaning solution 30 first, then, the residues washed away by the first cleaning solution 30 flow in the direction along with the centrifugal force for a certain distance. Then, the residues and the first cleaning solution 30 will be brought to the periphery of the wafer 18 by the second cleaning solution 32 later. In this way, the first clean solution 30 and the second cleaning solution 32 will not form turbulence during the cleaning process, and the residues can be washed away from the wafer 12 effectively.

The first cleaning solution 30 and the second cleaning solution 32 can be the same chemical solution. The first cleaning solution 30 and the second cleaning solution 32 can be deionized water, ammonia or other chemical solutions.

The first cleaning solution 30 can mix with a gas 36 such as nitrogen or carbon dioxide before spraying from the first nozzle 24. The second cleaning solution 32 also can mix with the gas 36 before spraying from the second nozzle 28. That is, cleaning solutions are pressurized by the gas 36 to control the flow rate of the cleaning solutions. Preferably, the first cleaning solution 30 can be pressurized by the gas 36 to make the flow rate of the first cleaning solution 30 0.1 l/min greater than the flow rate of the second cleaning solution 32.

Therefore, the ratio between the first cleaning solution 30 and the gas 36 can be different from the ratio between the second cleaning solution 32 and the gas 36. The flow rate of the first cleaning solution 30 and the second cleaning solution 32 can also be different.

The gas 36 used to pressurize the cleaning solutions could be chemicals which do not react with the residues such as nitrogen, or chemicals reacting with the residues. In addition, under the condition of the first cleaning solution 30 and the second cleaning solution 32 being the same, the concentration of the first cleaning solution 30 and the second cleaning solution 32 can be different, for example, the first cleaning solution 30 is 15 wt % ammonia, and the second cleaning solution 32 is 17 wt % ammonia.

The surface 20 to be washed can the front side of the wafer 18 and the backside of the wafer 18. The wafer cleaning can be performed just after a chemical mechanical polish (CMP) process, an etching process, or a development process. The first nozzle 24 and the second nozzle 28 can be fixed on the same holder 38. That is, the relative location of the first nozzle 24 and the second nozzle 28 is fixed. Therefore, during the cleaning process, the wafer 18 is rotated clockwise or counterclockwise, and the holder 38 can move front and back horizontally, that is, in a scan mode to wash the wafer 18.

Figure 3:
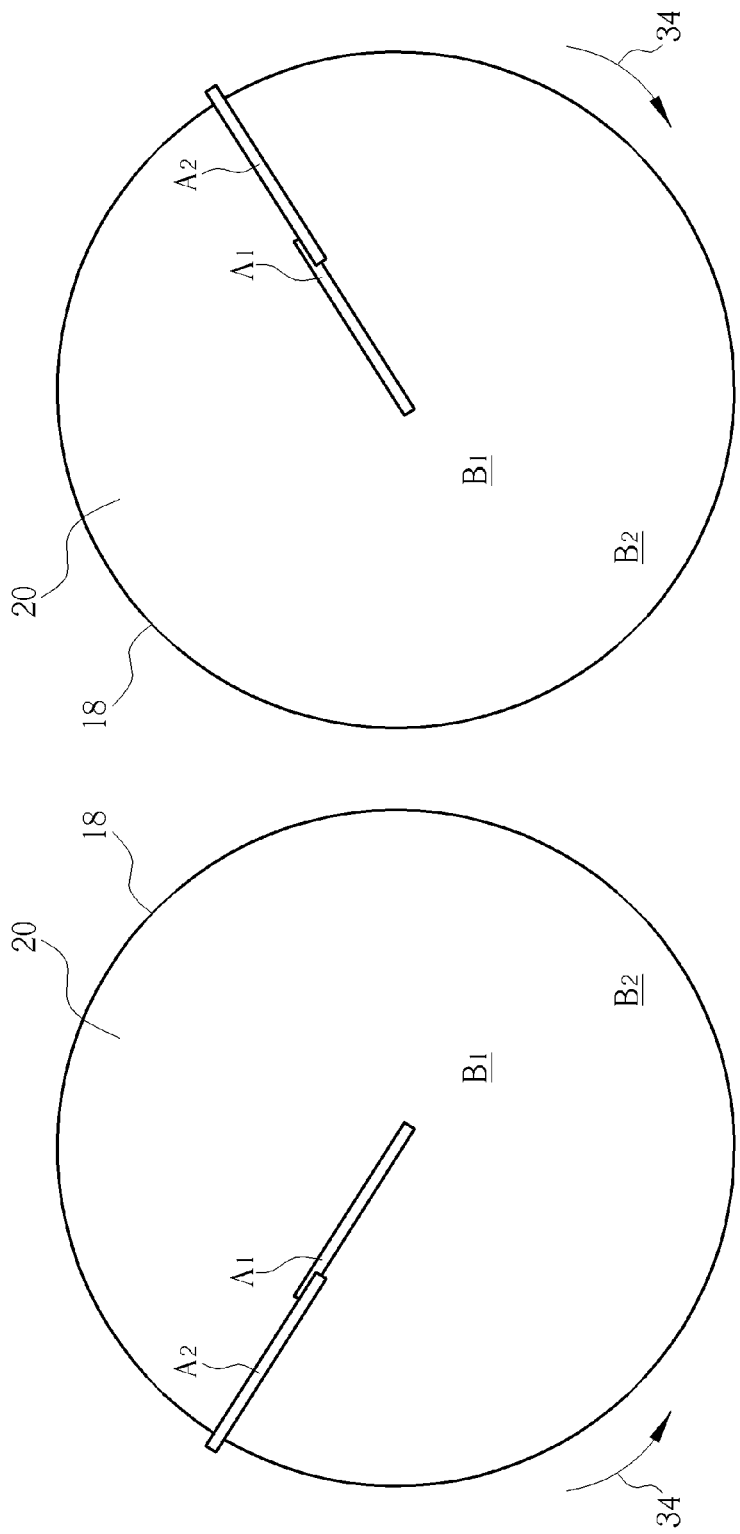
FIG. 3 depicts schematically a top view of a varied type of a rotating wafer cleaned by a cleaning solution according to the first embodiment of the present invention.

FIG. 3 depicts schematically a top view of a varied type of a rotating wafer cleaned by a cleaning solution. As shown in FIG. 3, the first spraying area $A_1$ and the second spraying area $A_2$ can be arranged to cover the radius of the wafer 18 jointly. Other operation conditions may be the same with that in FIG. 2.

To sum up, the first embodiment features that each nozzle has a spraying parameter, and the spraying parameter is a function of the relative location of the nozzle to the surface in horizontal direction. The spraying parameter includes the height between the nozzle and the surface, the flow rate of the cleaning solution, the cleaning solution used, the ratio between the cleaning solution and the gas, and the concentration of the cleaning solution. In other words, the height between the nozzle and the surface, the flow rate of the cleaning solution, the cleaning solution used, the ratio between the cleaning solution and the gas, and the concentration of the cleaning solution are changeable along with the horizontal relative location of the nozzle to the surface. Take the first embodiment as example, the first nozzle 24 and the second nozzle 26 are different in relative location to the surface 20 in horizontal direction, so at least one parameter selected from the height between the nozzle 24, 26 and the surface 20, the flow rate of the cleaning solution 30, 32, the composition cleaning solution 30, 32, the concentration of the cleaning solution 30, 32, or the ratio between the cleaning solution and the gas 30, 32 will be different.

Figure 4:
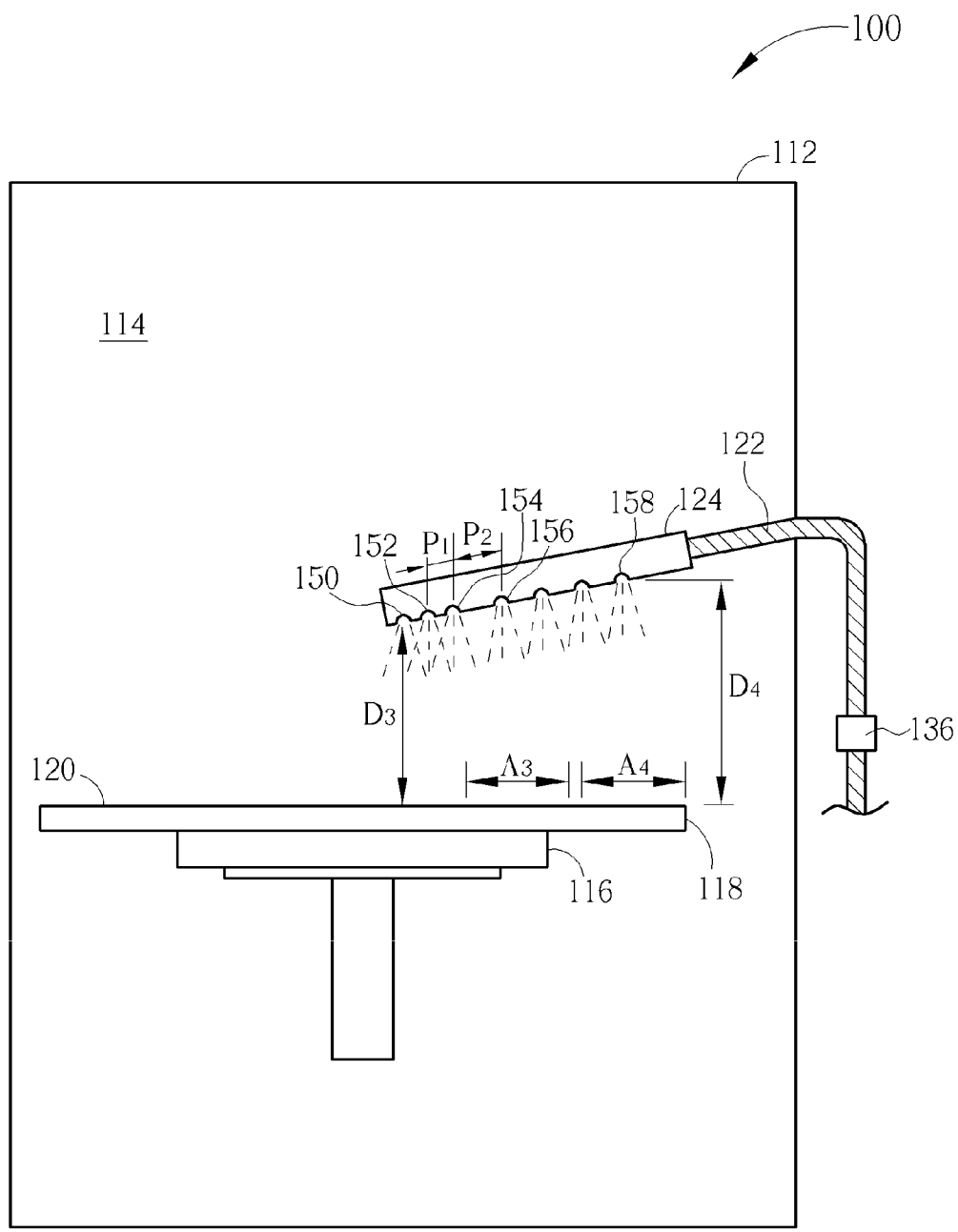
FIG. 4 depicts a wafer cleaning device schematically according to the second embodiment of the present invention.

FIG. 4 depicts a wafer cleaning device schematically according to the second embodiment of the present invention.

As shown in FIG. 4, a wafer cleaning device 100 includes a case 112 including a chamber 114. A stage 116 is disposed at the bottom of the chamber 114 for holding and rotating a wafer 118. The wafer 118 has a surface 120 to be washed. A transfer pipe 122 is disposed at the upper part of the chamber 114. A nozzle 124 connects to one end of the transfer pipe 122, and the nozzle 124 is disposed above and around the center of the wafer 118. The nozzle 124 includes a plurality of openings such as opening 150, 152, 154, 156, 158, wherein the heights between the surface 120 and each of the openings are different along with the horizontal relative location of each of the openings to the surface 120. For instance, as the openings 150, 158 are different in relative location to the surface 120 in the horizontal direction, the height $D_3$ between the opening 150 and the surface 120 and the height $D_4$ between the opening 158 and the surface 120 are different. According to a preferred embodiment of the present invention, the opening adjacent to the center of the wafer 118 is nearer to the surface 120 than the opening farther from the center of the wafer 118. For example, the height $D_3$ of the opening 150 is shorter than the height $D_4$ of the opening 158. In this way, under the condition that the cleaning solution has the same flow rate, a cleaning solution sprayed from the opening 150 will reach the surface 120 earlier than the cleaning solution sprayed from the opening 158. In addition, at least three of the openings have different distances between each other. For example, a first space $P_1$ between the openings 154, 156 and a second space $P_2$ between the openings 154, 156 is different.

During the wafer cleaning process, the wafer 118 is rotated toward clockwise or counterclockwise. A cleaning solution is sprayed from each of the openings and forms a plurality of spraying areas. For example, the spraying area $A_3$ is formed by the cleaning solution sprayed from the opening 156, and the spraying area A4 is formed by the cleaning solution sprayed from the opening 158. All the spraying areas cover the radius of the wafer 118 jointly. Moreover, the transfer pipe 122 can include a plurality of manifolds positioned corresponding to each of the openings. Therefore, the cleaning solution sprayed from each of the openings can be different. The cleaning solution can be deionized water, ammonia or other chemical solutions. The cleaning solution can mix with a gas 136 such as nitrogen or carbon dioxide before spraying from each of the openings. The gas 136 can be used to pressurize the cleaning solution to control the flow rate of the cleaning solution. Therefore, the ratio of the cleaning solution and the gas sprayed from each opening can be different, and the flow rate of the cleaning solution sprayed from each opening can be different as well. In addition, the concentration of the cleaning solution sprayed from each opening can be different, for example, the cleaning solution sprayed from the opening 150 is 15 wt % ammonia, and the cleaning solution sprayed from the opening 158 is 17 wt % ammonia.

Although only one nozzle 124 is depicted in FIG. 4, there can be more than one nozzle to provide higher cleaning performance.

Figure 5:
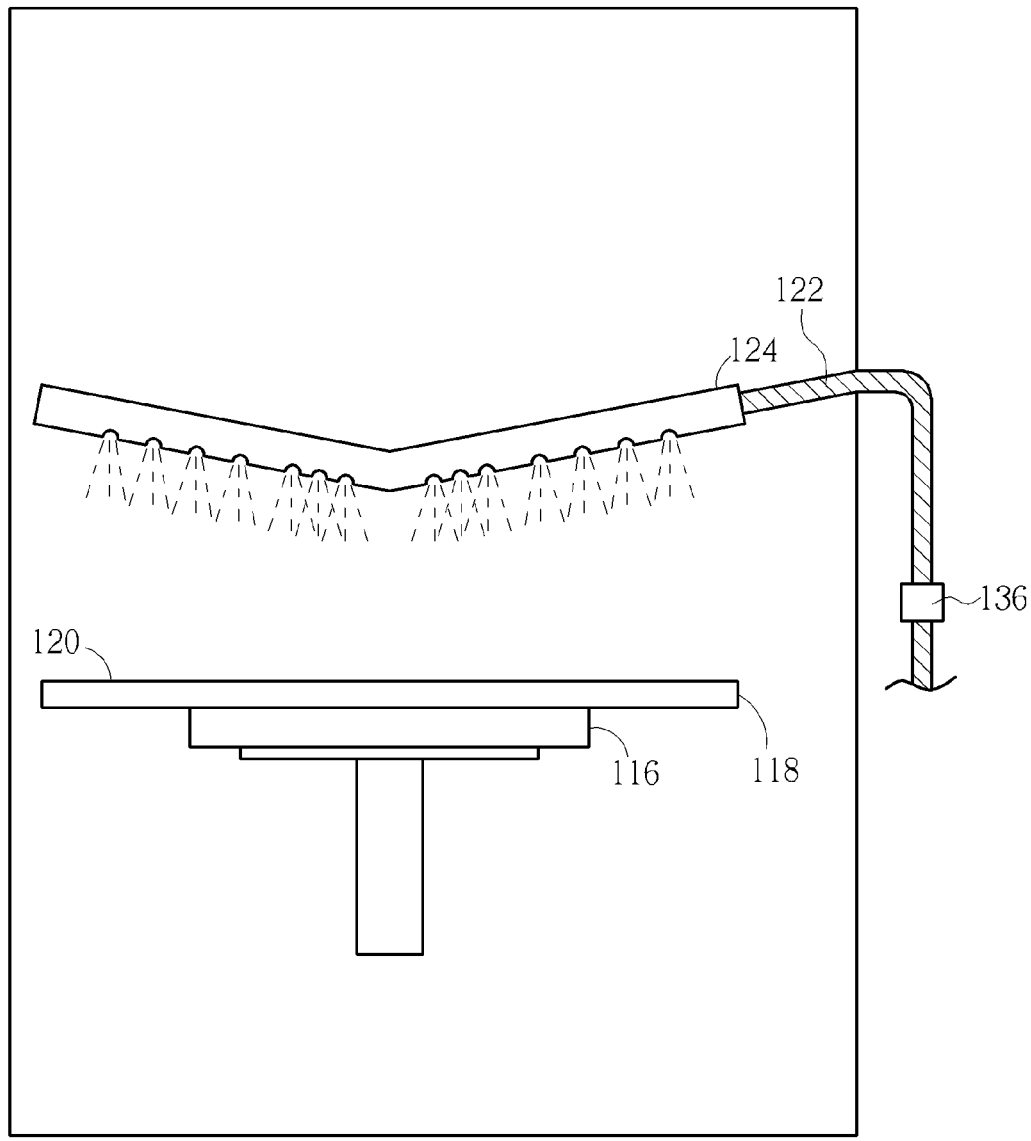
FIG. 5 depicts a varied type of the wafer cleaning according to the second embodiment of the present invention.

FIG. 5 depicts a varied type of the wafer cleaning of the second embodiment of the present invention. Elements with the same function will designated with the same numeral reference in FIG. 4.

As show in FIG. 5, the nozzle 124 can be a V shape and with a plurality of openings on the nozzle 124. The difference between the FIG. 4 and FIG. 5 is that the spraying areas in FIG. 5 cover the diameter of the wafer 118 jointly.

The surface 120 to be washed can be the front side of the wafer 118 and the backside of the wafer 118. The wafer cleaning process can be performed just after a chemical mechanical polish (CMP) process, an etching process, or a development process. During the cleaning process, the wafer 118 is rotated clockwise or counterclockwise, and the nozzle 124 can move front and back horizontally, that is, in a scan mode to wash the wafer 118.

To sum up, the second embodiment features that the nozzle 124 has a spraying parameter, and the spraying parameter is a function of the horizontal relative location of each opening to the surface. The spraying parameter includes the height between the each opening and the surface, the flow rate of the cleaning solution, the cleaning solution used, the ratio between the cleaning solution and the gas, and the concentration of the cleaning solution. In other words, the height between each opening and the surface, the flow rate of the cleaning solution, the cleaning solution used, the ratio between the cleaning solution and the gas, and the concentration of the cleaning solution are changeable along with the horizontal relative location of each opening to the surface. For example, the openings 150, 158 are different in relative location to the surface 20 in horizontal direction, so at least one parameter selected from the height between the opening and the surface, flow rate of the cleaning solution, the cleaning solution used, the concentration of the cleaning solution, or the ratio between the cleaning solution and the gas will be different.

Therefore, the center and the periphery of the wafer may have different cleaning conditions, for instance, a higher flow rate of the cleaning solution is used to clean the center of the wafer and a lower flow rate of the cleaning solution is used to clean the periphery of the wafer. In this way, the residues can be removed completely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer cleaning device, comprising:
   a stage for holding a wafer having a surface; and
   a nozzle positioned above the wafer, and the nozzle comprising a plurality of openings, wherein heights are distances between the surface and each of the openings, the heights between the surface and each of the openings are different along with the relative location of each of the openings to the surface, and the surface is selected from a front side of the wafer and a backside of the wafer.

2. The wafer cleaning device of claim 1, wherein at least three of the openings have different distances between each other.

3. The wafer cleaning device of claim 1, wherein cleaning solutions sprayed from the openings are different.

4. The wafer cleaning device of claim 1, wherein a cleaning solution is sprayed from each of the openings and forms a plurality of spraying areas, and the spraying areas cover a diameter of the wafer jointly.

5. The wafer cleaning device of claim 1, wherein a cleaning solution is sprayed from each of the openings and forms a plurality of spraying areas, and the spraying areas cover a radius of the wafer jointly.

6. The wafer cleaning device of claim 1, further comprising a plurality of the nozzles disposed above the wafer.

7. The wafer cleaning device of claim 1, wherein the surface undergoes a process selected from the group consisting of a chemical mechanical polish (CMP) process, an etching process, and a development process.

8. A wafer cleaning method, comprising:
  providing a wafer having a surface and a nozzle comprising a plurality of openings above the wafer, wherein heights are distances between the surface and each of the openings, the heights between the surface and each of the openings are different along with the relative location of each of the openings to the surface, the surface is selected from a front side of the wafer and a backside of the wafer; and
  rotating the wafer and spraying a cleaning solution from each of the openings to clean the surface, wherein each of the openings has a spraying parameter individually, and the spraying parameter is a function of the relative location of each of the openings to the surface.

9. The wafer cleaning method of claim 8, wherein the cleaning solution mixes with a gas before spraying from each of the openings.

10. The wafer cleaning method of claim 9, the spraying parameter is selected from the group consisting of the flow rate of the cleaning solution, the cleaning solution used, the ratio between the cleaning solution and the gas, and the concentration of the cleaning solution.

11. The wafer cleaning method of claim 8, wherein the wafer cleaning method is performed after a process selected from the group consisting of a chemical mechanical polish (CMP) process, an etching process, or a development process.

12. The wafer cleaning method of claim 8, wherein a cleaning solution is sprayed from each of the openings and forms a plurality of spraying areas covering a diameter of the wafer jointly.

* * * * *